US012787548B2

(12) United States Patent
Jeong et al.

(10) Patent No.: US 12,787,548 B2
(45) Date of Patent: Nov. 3, 2026

(54) TRANSISTOR AND DISPLAY DEVICE INCLUDING THE SAME

(71) Applicant: LG Display Co., Ltd., Seoul (KR)

(72) Inventors: Mi Jin Jeong, Paju-si (KR); Dong Chae Shin, Paju-si (KR); Jeong Beom Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/988,546

(22) Filed: Dec. 19, 2024

(65) Prior Publication Data

US 2025/0212607 A1 Jun. 26, 2025

(30) Foreign Application Priority Data

Dec. 22, 2023 (KR) ........................ 10-2023-0190254

(51) Int. Cl.
*H10K 59/121* (2023.01)
*G09G 3/3258* (2016.01)

(52) U.S. Cl.
CPC ....... *H10K 59/1213* (2023.02); *G09G 3/3258* (2013.01); *G09G 2300/0408* (2013.01); *G09G 2300/0819* (2013.01); *G09G 2300/0852* (2013.01); *G09G 2320/0233* (2013.01); *G09G 2330/023* (2013.01)

(58) Field of Classification Search
CPC ......... G09G 3/3258; G09G 2320/0233; G09G 2300/0852; G09G 2300/0408; G09G 2300/0819; G09G 2330/023; H10K 59/1213
See application file for complete search history.

(56) References Cited

U.S. PATENT DOCUMENTS

| | | | | |
|---|---|---|---|---|
| 2001/0026257 A1* | 10/2001 | Kimura | G09G 3/2022 | 345/87 |
| 2015/0123081 A1* | 5/2015 | Huang | G09G 3/3258 | 257/40 |
| 2015/0144923 A1* | 5/2015 | Choo | H10D 1/00 | 438/23 |
| 2017/0256569 A1* | 9/2017 | Ohara | H10D 30/0314 | |
| 2017/0294460 A1* | 10/2017 | Lee | H10D 86/423 | |
| 2018/0286888 A1* | 10/2018 | Yamaguchi | H10D 30/67 | |
| 2019/0027612 A1* | 1/2019 | Zhang | H10D 30/0314 | |
| 2020/0212077 A1 | 7/2020 | Jang et al. | | |
| 2023/0104382 A1 | 4/2023 | Jeong et al. | | |

FOREIGN PATENT DOCUMENTS

| | | |
|---|---|---|
| KR | 10-2018-0062207 A | 6/2018 |
| KR | 10-2018-0074260 A | 7/2018 |
| KR | 10-2020-0079894 A | 7/2020 |
| KR | 10-2157689 B1 | 9/2020 |
| KR | 10-2021-0064921 A | 6/2021 |
| KR | 10-2023-0047845 A | 4/2023 |

* cited by examiner

*Primary Examiner* — Shaheda A Abdin
(74) *Attorney, Agent, or Firm* — Fenwick & West LLP

(57) ABSTRACT

Disclosed is a display device including a substrate including a display area and a non-display area, a first transistor disposed in the display area and including a first gate electrode and a first active layer, and a second transistor disposed in the display area, and including a second gate electrode, a first source drain electrode, a second source drain electrode, and a stopper, wherein the stopper contacts the second active layer at a bottom of each of the first source drain electrode and the second source drain electrode of the second transistor, and a display device including the same.

16 Claims, 11 Drawing Sheets

TRANSISTOR AND DISPLAY DEVICE INCLUDING THE SAME

CROSS-REFERENCE TO RELATED APPLICATION

This application claims the benefit of Republic of Korea Patent Application No. 10-2023-0190254, filed on Dec. 22, 2023, which is hereby incorporated by reference in its entirety.

BACKGROUND

Field of Technology

The present disclosure relates to a transistor and a display device including the same, and more specifically, a transistor to improve reliability and a display device including the same.

Discussion of the Related Art

Display devices for displaying images in TVs, monitors, mobile phones, tablet computers, and laptops are used in various modes and configurations.

Display devices include a display panel having a plurality of light emitting elements or liquid crystals for displaying an image, and transistors for controlling the operation of each light emitting element or liquid crystal, to display an image to be displayed through the light emitting elements or liquid crystals.

A display device includes a plurality of pixels and is provided with a plurality of driving and switching elements to drive and control the pixels. The driving and switching elements may include transistors and the transistors are widely applied to integrated circuits as well as to pixels.

Recently, various research and development efforts have been conducted to improve the performance and reliability of transistors.

SUMMARY

Accordingly, the disclosure is directed to a transistor and a display device including the same that substantially obviate one or more problems due to the limitations and disadvantages of the related art.

It is one object of the present disclosure to provide a transistor with improved reliability and a display device including the same.

It is another object of the present disclosure to provide a transistor to increase the threshold voltage and reduce the size of the transistor, and a display device including the same.

It is another object of the present disclosure to provide a transistor that maintains a uniform on-state current level, prevents an increase in the level of an off-state current, reduces the occurrence of leakage current, and exhibits uniform brightness, and a display device including the same.

It is another object of the present disclosure to provide a transistor that reduces the defect rate of display devices and reduces the amounts of materials used throughout the manufacturing process, such as gas and etchant to manufacture display devices, and reduces greenhouse gases generated by the manufacturing process, and a display device including the same.

Additional advantages, objects, and features of the disclosure will be set forth in part in the description which follows and in part will become apparent to those having ordinary skill in the art upon examination of the following, or may be learned from practice of the disclosure. The objectives and other advantages of the disclosure may be realized and attained by the structure particularly pointed out in the written description and claims hereof as well as the appended drawings.

A transistor according to one embodiment of the present disclosure includes an active layer containing an oxide semiconductor material, being disposed on a substrate, and including a channel region, and a first source drain region and a second source drain region with the channel region interposed therebetween, a gate electrode disposed on the active layer so as to overlap the channel region, a first source drain electrode and a second source drain electrode respectively connected to the first and second source drain regions, and a stopper disposed to overlap the first and second source drain regions of the active layer and connected to each of the first and second source drain electrodes.

A display device according to another embodiment of the present disclosure includes a substrate including a display area and a non-display area, a first transistor disposed in the display area and including a first gate electrode and a first active layer, and a second transistor disposed in the display area, and including a second gate electrode, a first source drain electrode, a second source drain electrode, and a stopper, wherein the stopper contacts the second active layer at a bottom of each of the first source drain electrode and the second source drain electrode of the second transistor.

The second active layer may contain an oxide semiconductor material and the stopper may contain the same material as the second active layer.

The stopper may contain a hydrogen-capturing component, Ti.

The stopper may be disposed on an insulating film below the second active layer such that at least a part of top and side surfaces of the stopper contacts the second active layer, and an area of the stopper may be larger than an area of a bottom surface of the first source drain electrode or the second source drain electrode.

A thickness of the second active layer overlapping the second gate electrode of the second transistor may be smaller than a total of thicknesses of the second active layer and the stopper overlapping the first source drain electrode or the second source drain electrode of the second transistor.

The stopper may fill an insulating film under the second active layer such that at least a part of a top surface of the stopper contacts the second active layer.

It is to be understood that both the foregoing general description and the following detailed description of the disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
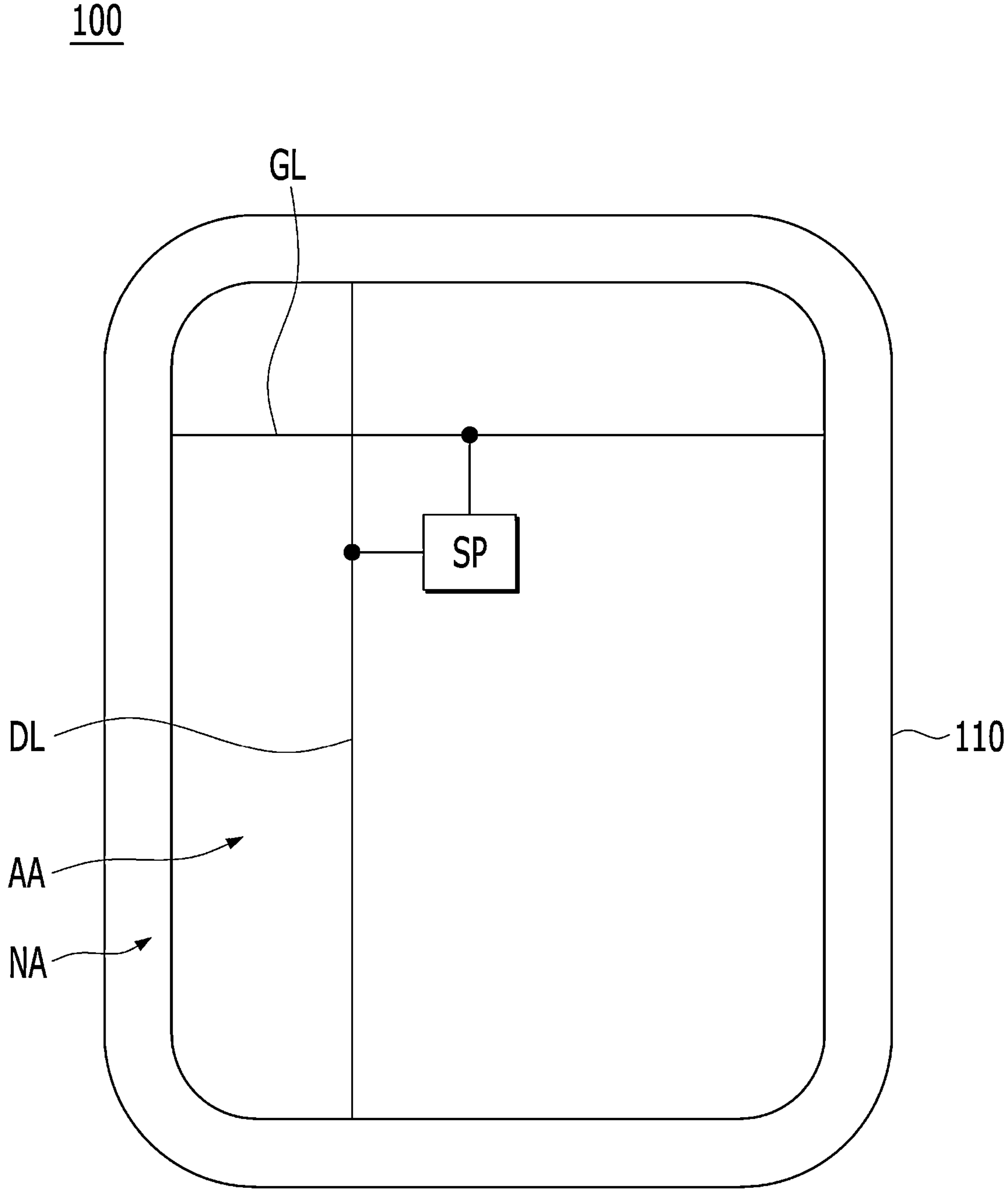
FIG. 1 is a plan view illustrating a display device according to one embodiment.

Hereinafter, a preferred example of a display device according to an embodiment of the present disclosure will be described in detail with reference to the attached drawings.

Like reference numbers refer to like components throughout the description of the figures. The thickness, ratio, size, and the like of components shown in the drawings to illustrate various embodiments of the present disclosure are exaggerated for better illustration. The scale of the components shown in the drawings is different from the actual scale for better illustration and is therefore not limited to the scale shown in the drawings.

It will be understood that, when an element (or a region, layer, film or part) is referred to as being "on", "connected to" or "bound to" another element, it may be directly on, connected to or bound to the other element, or an intervening element may also be present therebetween.

The expression "and/or" includes all combinations of one or more that the associated configurations may define.

In describing the variety of embodiments of the present disclosure, terms such as "first" and "second" may be used to describe a variety of components, but these terms only aim to distinguish the same or similar components from one another. Accordingly, throughout the disclosure, a "first" component may be referred to as a "second" component within the technical concept of the present disclosure. Similarly, a "second" component may be referred to as a "first" component within the technical concept of the present disclosure. Singular forms are intended to include plural forms as well, unless the context clearly indicates otherwise.

Spatially relative terms, such as "below", "beneath", "above", and "upper", may be used herein to describe the relationship between elements as shown in the figures. It will be understood that these terms are spatially relative and thus described based on the orientation depicted in the figures. For example, at least one intervening element may be present between the two elements, unless "immediately" or "directly" is used. Spatially relative terms, such as "below", "beneath", "above", and "upper", may be used herein to easily describe the correlation between one element or component and other elements or components. It will be understood that spatially relative terms are intended to encompass different orientations of a device during the use or operation of the device, in addition to the orientation depicted in the figures. For example, if a device in one of the figures is turned upside down, elements described as "below" or "beneath" other elements would then be positioned "above" the other elements. The exemplary term "below" or "beneath" can, therefore, encompass the meanings of both "below" and "above".

It will be further understood that the terms "comprises" and/or "has", when used in this specification, specify the presence of stated features, integers, steps, operations, elements, parts or combinations thereof, but do not preclude the presence or addition of one or more other features, integers, steps, operations, elements, parts, or combinations thereof.

Features of various embodiments of the present disclosure may be partially or completely integrated or combined with each other, and may be variously interoperated with each other and driven technically. The embodiments of the present disclosure may be carried out independently from each other, or may be carried out together in an interrelated manner.

Figure 2:
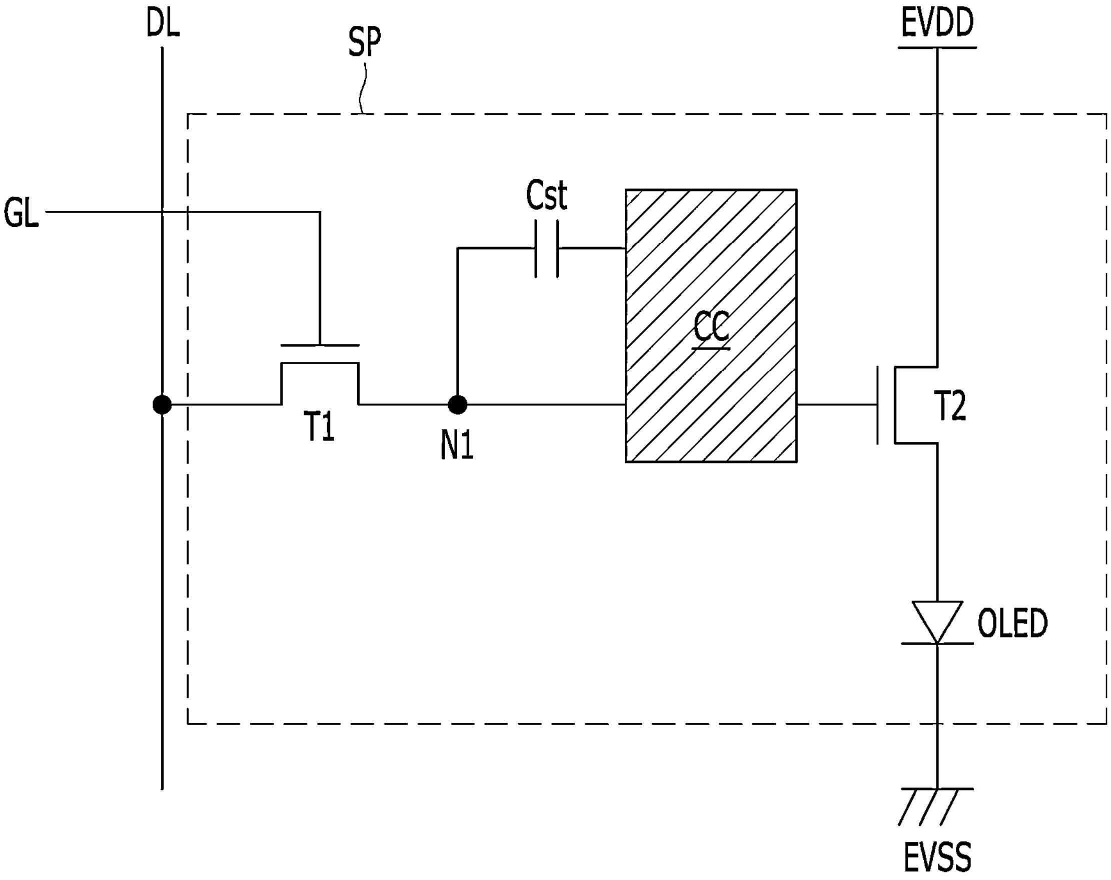
FIG. 2 is a circuit diagram illustrating a sub-pixel according to one embodiment.
Figure 3:
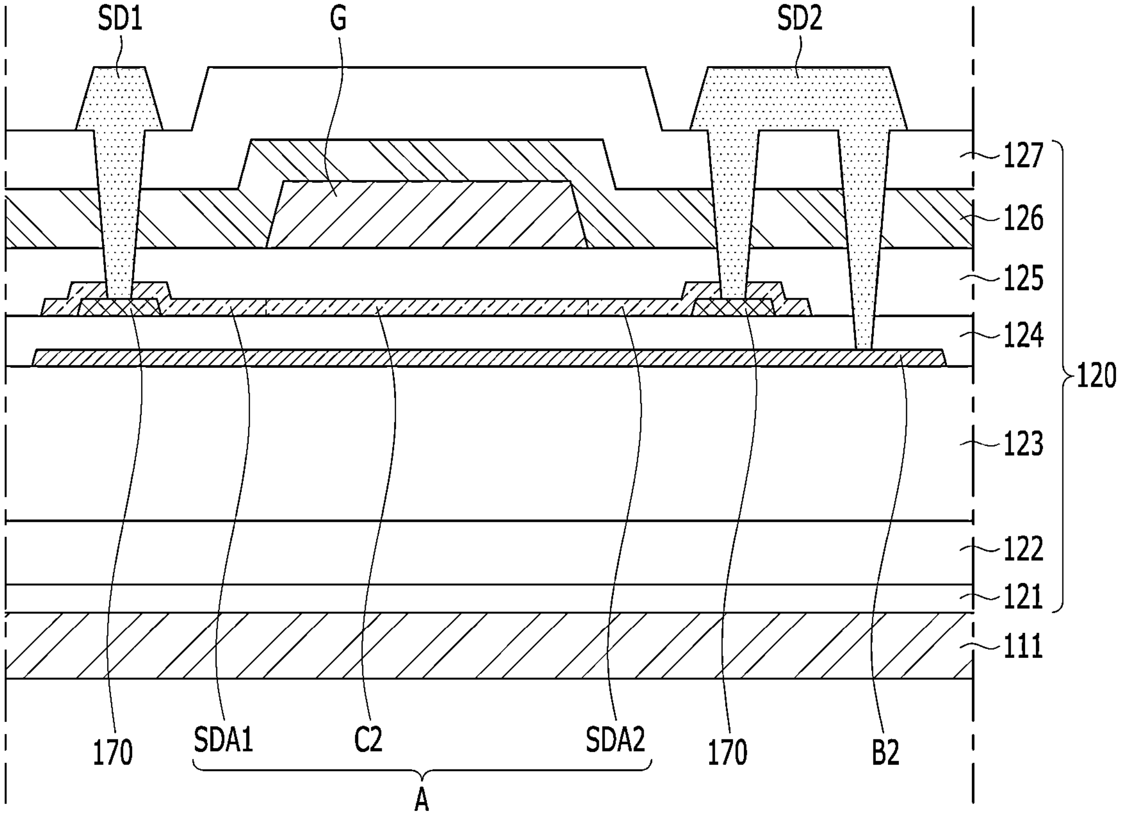
FIG. 3 is a cross-sectional view illustrating a transistor according to one embodiment.

FIG. 1 is a plan view illustrating a display device according to one embodiment, FIG. 2 is a circuit diagram illustrating a sub-pixel according to one embodiment, and FIG. 3 is a cross-sectional view illustrating a transistor according to one embodiment.

Referring to FIGS. 1 and 2, the display device 100 according to an example of the present disclosure includes a display panel 110 and may be divided into a display area AA and a non-display area NA.

The display area AA is an area that displays an image. A plurality of sub-pixels SP are disposed in the display area AA of the display panel 110, and an image may be displayed using the plurality of sub-pixels SP. The area where the plurality of sub-pixels SP are arranged may be the display area AA, and the area other than the display area AA may be the non-display area NA.

The non-display area NA may be disposed in an edge area surrounding the display area AA that displays the image. At least one driver for driving a plurality of sub-pixels SP may be disposed in the non-display area NA. The driver may be a gate-in-panel (GIP).

Various additional elements may be further disposed in the non-display area NA to drive the sub-pixels SP in the display area AA.

Among the pixels, at least one sub-pixel SP includes a first transistor T1, a second transistor T2, a capacitor Cst, a compensation circuit CC, and an organic light emitting diode (OLED, 145, see FIG. 11), as shown in FIG. 2.

For example, the first transistor T1 may be a switching transistor and the second transistor T2 may be a driving transistor.

The first electrode (e.g., drain electrode) of the first transistor T1 is electrically connected to the data line DL, and the second electrode (e.g., source electrode) is electrically connected to the first node N1. The gate electrode of the first transistor T1 is electrically connected to the gate line GL. The first transistor T1 transmits the data signal supplied through the data line DL to the first node N1 in response to the scan signal supplied through the gate line GL.

The capacitor Cst is electrically connected to the first node N1 and charges the voltage applied to the first node N1.

Figure 11:
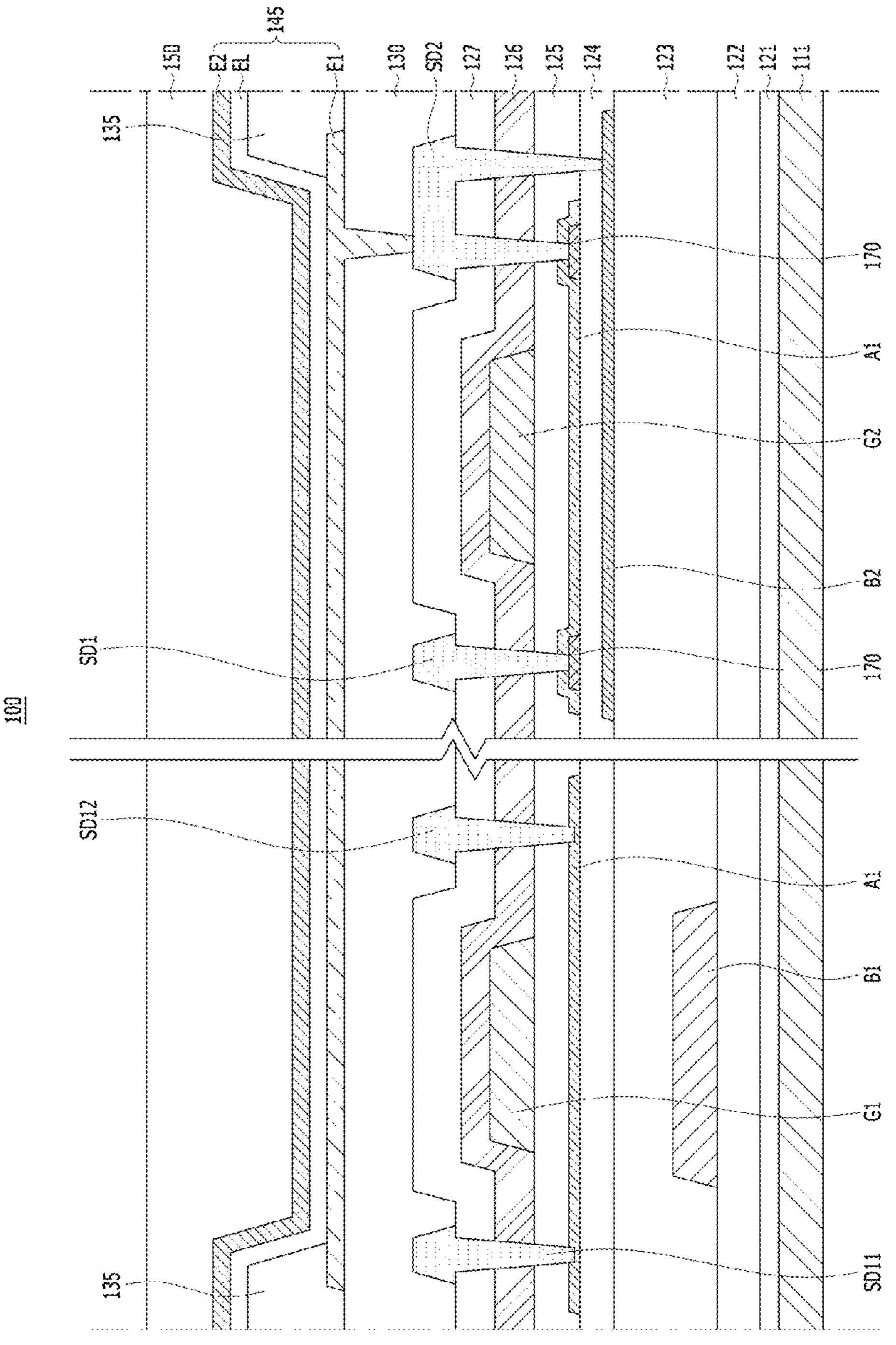
FIG. 11 is a cross-sectional view illustrating a display device according to one embodiment.

The first electrode (e.g., drain electrode) of the second transistor T2 receives a high potential driving voltage (EVDD), and the second electrode (e.g., source electrode) is electrically connected to a first electrode (e.g., an anode, E1, see FIG. 11). The second transistor T2 can control the amount of driving current flowing through the organic light emitting diode (OLED) in response to the voltage applied to the gate electrode.

The semiconductor layer of the first transistor T1 and/or the second transistor T2 may contain silicon such as amorphous silicon (a-Si), polycrystalline silicon (poly-Si), or low-temperature polycrystalline silicon (poly-Si), or may contain an oxide such as IGZO (indium-gallium-zinc-oxide), but is not limited thereto.

The organic light emitting diode (OLED) outputs light corresponding to the driving current. The organic light emitting diode (OLED) may output light with any one of red, green, blue, and white.

The organic light emitting diode (OLED) may include an anode, a light emitting layer disposed on the anode, and a cathode supplying a common voltage. The light emitting layer may be implemented to emit light of the same color for each pixel, such as white light, or may be implemented to emit different colors for each sub-pixel SP, such as red, green, or blue light.

The organic light emitting diode (OLED) may be a front-emitting diode or a back-emitting diode.

The compensation circuit CC may be provided in the sub-pixel SP to compensate for the threshold voltage of the second transistor T2. The compensation circuit CC may include one or more transistors. The compensation circuit CC may include at least one transistor and capacitor, and may be configured in various configurations depending on the compensation method. The pixel including the compensation circuit CC may have various structures such as 3T1C, 4T2C, 5T2C, 6T1C, 6T2C, 7T1C, and 7T2C.

Referring to FIG. 3, according to an embodiment of the present disclosure, the active layer A of the second transistor T2 may contain an oxide semiconductor material. The active layer A includes a channel region C2, and first and second source drain regions SDA1 and SDA2. The second transistor T2 is connected to the gate electrode G overlapping the channel region C2 of the active layer A, and a first source drain electrode SD1 and a second source drain electrode SD2 respectively connected to the first and second source drain regions SDA1 and SDA2 of the active layer A.

The second transistor T2 is disposed on the substrate 111, and the substrate 111 serves to support and protect components of the display device 100 disposed thereon.

The substrate 111 is made of a flexible plastic material and is flexible. The substrate 111 may be formed of polyimide and may contain a flexible and thin glass material.

The substrate 111 may independently include a support substrate such as PET (polyethylene terephthalate) and a polyimide film. The substrate 110 may include an adhesive film such as pressure sensitive adhesive (PSA) to adhere the PET to the polyimide film. The substrate 111 may have a structure in which two layers are stacked via an intermediate layer (not shown) interposed therebetween.

A plurality of stacked insulating films 120 are disposed on the display area AA and the non-display area NA of the substrate 111 to insulate the electrodes constituting the second transistor T2 from each other. The insulating film 120 includes a first insulating film 121, a second insulating film 122, a third insulating film 123, a fourth insulating film 124, a fifth insulating film 125, a sixth insulating film 126, and a seventh insulating film 127.

The first insulating film 121 is disposed in the display area AA and the non-display area NA on the substrate 111. The first insulating film 121 may be called a "buffer film" and may have the same function as the buffer film known in the technical field. The first insulating film 121 is disposed on the substrate 111 to protect structures on the substrate 111 that are vulnerable to moisture permeation from moisture penetrating through the substrate 111 and to planarize the surface of the substrate 111.

The first insulating film 121 is disposed on the edge of the substrate 111 to prevent moisture from penetrating from the edge of the substrate 111. The first insulating film 121 may be a single inorganic film or may include a plurality of inorganic films alternately stacked.

For example, the first insulating film 121 may include at least one inorganic film selected from the group consisting of a silicon oxide (SiOx) film, a silicon nitride (SiNx), and a silicon oxynitride (SiOxNy) film, or may include a multilayer film in which the inorganic films described above are stacked.

The second insulating film 122 may be disposed on the first insulating film. The second insulating film 122 may function as a second buffer layer and may also function as a gate insulating film for transistors (not shown) constituting the gate driver (not shown) disposed in the non-display area NA.

The second insulating film 122 may include an inorganic film, for example, a silicon oxide film (SiOx), or a silicon nitride film (SiNx), or a multilayer film thereof.

The third insulating film 123 may be disposed on the second insulating film 122. The third insulating film 123 may function as an interlayer insulating film for transistors (not shown) constituting the gate driver (not shown) disposed in the non-display area NA.

The third insulating film 123 may contain an inorganic material. The inorganic material may include, for example, silicon nitride (SiNx).

The fourth insulating film 124 may be disposed on the third insulating film 123. The fourth insulating film 124 may function as a buffer layer. The fourth insulating film 124 may include the active layer A disposed thereon and may serve to planarize the top surface for the base of the second transistor T2.

The fourth insulating film 124 may contain an inorganic material. The inorganic material may include, for example, a silicon oxide film (SiOx) or a multilayer film in which inorganic films are stacked.

When the fourth insulating film 124 includes a silicon oxide film, hydrogen particles are not discharged during heat treatment, or the like, during the process, to prevent reduction in reliability of the active layer A containing an oxide semiconductor material adjacent to the fourth insulating film 124 due to hydrogen particles.

In particular, the driving transistor directly contributes to the operation of the light emitting device and it is important to secure reliability. For this purpose, the structure for securing the reliability of the transistor according to embodiments of the present disclosure will be further described in detail later.

The active layer A may be disposed on the fourth insulating film 124.

The active layer A includes a channel region C2 overlapping the gate electrode G, and first and second source drain regions SDA1 and SDA2 respectively connected to the first and second source drain electrodes SD1 and SD2.

The channel region C2 is an area that overlaps the gate electrode G and through which carriers move. The channel region C2 may not be doped with impurities.

The first source drain area SDA1 and the second source drain area SDA2 are areas excluding the channel area C2, and are respectively connected to the first source drain electrode SD1 and the second source drain electrode SD2 to inject electrons and holes. The first source drain area SDA1 and the second source drain area SDA2 may be disposed on both sides of the channel area C2 with the channel area C2 interposed therebetween.

The first source drain area SDA1 and the second source drain area SDA2 include a conductive portion doped with impurities, and the like. The first source drain area SDA1 and the second source drain area SDA2 may include a mixed area of a conductive area doped with impurities and a non-conducting area not doped with impurities.

The active layer A contains an oxide semiconductor material. The oxide semiconductor material is an oxide of metal such as zinc (Zn), indium (In), gallium (Ga), tin (Sn), and titanium (Ti), or a combination of a metal such as zinc (Zn), indium (In), gallium (Ga), tin (Sn), or titanium (Ti), and an oxide thereof.

More specifically, the oxide semiconductor material constituting the active layer A include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), or the like.

The active layer A of the second transistor T2 includes the oxide semiconductor material, thereby improving the effects of blocking leakage current and reducing power consumption.

The fifth insulating film 125 may be disposed on the active layer A. Since the active layer A is disposed on the fourth insulating film 124 in a pattern shape, the fifth insulating film 125 is disposed to cover the top and side surfaces of the active layer A.

Since the fifth insulating film 125 is disposed to cover the active layer A containing an oxide semiconductor material, it may be made of an inorganic material containing no hydrogen particles. For example, the fifth insulating film 125 may include a silicon oxide layer (SiOx) or multiple layers in which inorganic layers are stacked. The fifth insulating film 125 may function as a gate insulating film.

The gate electrode G may be disposed on the fifth insulating film 125. The gate electrode G turns on or turns off the second transistor T2 in response to a signal from the compensation circuit CC or the capacitor Cst shown in FIG. 2. The gate electrode G is insulated from the active layer A through the fifth insulating film 125, and is arranged such that at least part of the gate electrode overlaps the active layer A to form a channel region C2 in the active layer A.

The gate electrode G may contain a conductive metal material. Specifically, the conductive metal material includes at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). The gate electrode G may have a multilayer structure including at least two conductive metal materials.

The sixth insulating film 126 and the seventh insulating film 127 may be disposed on the gate electrode G. The sixth insulating film 126 covers the top and sides of the gate electrode G and insulates the first source drain electrode SD1, the second source drain electrode SD2 and the gate electrode G from each other.

The sixth insulating film 126 may be a single inorganic layer or may include a plurality of stacked inorganic layers. The inorganic film may contain at least one inorganic material of silicon oxide (SiOx), silicon nitride (SiNx), or silicon oxynitride (SiOxNy).

The seventh insulating film 127 disposed on the sixth insulating film 126 may be disposed to planarize the top surface of the second transistor T2 including a pattern such as the active layer A or the gate electrode G.

The seventh insulating film 127 may contain an organic material, an inorganic material, or may be a laminate of an organic film and an inorganic film.

A first source drain electrode SD1 and a second source drain electrode SD2 may be disposed on the seventh insulating film 127. The first source drain electrode SD1 and the second source drain electrode SD2 may be spaced from each other with the gate electrode G interposed therebetween. In this case, the first source drain electrode SD1, the second source drain electrode SD2, and the gate electrode G may be disposed on different layers as described above.

The first source drain electrode SD1 and the second source drain electrode SD2 may contain a conductive metal material. Specifically, the conductive metal material includes at least one of an aluminum-based metal such as aluminum (Al) or an aluminum alloy, a silver-based metal such as silver (Ag) or a silver alloy, a copper-based metals such as copper (Cu) or a copper alloy, a molybdenum-based metal such as molybdenum (Mo) or a molybdenum alloy, chromium (Cr), tantalum (Ta), neodymium (Nd), or titanium (Ti). The first source drain electrode SD1 and the second source drain electrode SD2 may have a multilayer structure including at least two conductive metal materials.

The first source drain electrode SD1 and the second source drain electrode SD2 are each connected to the active layer A. The first source drain electrode SD1 is connected to the first source drain area SDA1 of the active layer A, and the second source drain electrode SD2 is connected to the second source drain area SDA2 of the active layer A. For example, each of the first source drain electrode SD1 and the second source drain electrode SD2 may be connected to the active layer A through contact holes of the sixth and seventh insulating films 126 and 127.

When the first source drain electrode SD1 and the second source drain electrode SD2 are respectively connected to the active layer A, each of the first source drain electrode SD1 and the second source drain electrode SD2 is connected to a stopper 170.

The stopper 170 prevents loss of the active layer A that may occur during the etching process.

The stopper 170 may be disposed under the active layer A to overlap the first source drain area SDA1 and the second source drain area SDA2 of the active layer A. The stopper 170 prevents the stopper 170 from being over-etched and thus prevents the active layer A from being lost or reduces the area of the active layer A that is lost during an etching process for connecting the first source drain electrode SD1 and the second source drain electrode SD2 to the active layer A, for example, a process for forming a contact hole in the sixth insulating film 126 and the seventh insulating film 127.

Specifically, the stopper 170 may contact the active layer A at the bottom of the first source drain electrode SD1 and the second source drain electrode SD2. The stopper 170 protrudes from the top surface of the substrate 111 and does not overlap the gate electrode G, but overlaps the first source drain region SD1 and the second source drain region SD2.

Even if the active layer A is lost during the etching process, each of the first source drain electrode SD1 and the second source drain electrode SD2 may be connected to the stopper 170. Each of the first source drain electrode SD1 and the second source drain electrode SD2 can smoothly inject electrons and holes into the active layer A through the stopper 170 contacting the active layer A, and increase the area where each of the source drain electrodes SD1 and the second source drain electrode SD2 contacts the active layer. As a result, even if the active layer A is lost during the manufacturing process of the second transistor T2, the stopper 170 can prevent reduction in charge transfer.

The second transistor T2 can prevent the amount of current flowing in the active layer A from decreasing through the stopper 170, and can maintain uniform luminance.

The second transistor T2 can maintain the level of the on-state current of the transistor uniformly through the stopper 170 and prevent the level of the off-state from rising, thereby reducing the occurrence of leakage current.

Furthermore, when the stopper 170 is disposed under the active layer A as in one embodiment of the present disclosure, the thickness of the active layer A can be reduced, the voltage threshold (Vth) can be increased, and the size of the transistor can be reduced due to the decrease in the channel thickness of the active layer A. In other words, the threshold voltage (Vth) may be lowered as the size of the transistor decreases. However, in the present disclosure, the threshold voltage (Vth) may be increased by reducing the thickness of the channel region C2 of the active layer A. As a result, it is possible to prevent reduction of the threshold voltage (Vth) and thus secure the stability and reliability of the transistor.

In one embodiment, the stopper 170 is arranged in a spaced pattern so as to overlap the bottom surface of the first source drain electrode SD1 and the bottom surface of the second source drain electrode SD2 on the insulating film 120, for example, the fourth insulating film 124, under the active layer A. At least a part of the top and side surfaces of the stopper 170 may contact the active layer A.

At least a part of the bottom surface of the first source drain electrode SD1 or the second source drain electrode SD2 of the second transistor T2 contacts the active layer A and at least a part of the bottom surface of the first source drain electrode SD1 or the second source drain electrode SD1 may contact the stopper 170.

The width or area of the stopper 170 may be greater than the width or area of the bottom of the first source drain electrode SD1 where the first source drain electrode SD1 contacts the first source drain area SDA1, and may be greater than the width or area of the bottom of the second source drain electrode SD2 where the second source drain electrode SD2 contacts the second source drain area SDA2. When the width or area of the stopper 170 is greater than the width or area of the bottom of the first source drain electrode SD1 where the first source drain electrode SD1 contacts the first source drain area SDA1, or the width or area of the bottom of the second source drain electrode SD2 where the second source drain electrode SD2 contacts the second source drain area SDA2, it is possible to prevent reduction of the contact area between the electrode SD2 and the active layer A and an increase in resistance. The stopper 170 according to the present disclosure can improve the charge flow of the second transistor T2, thereby improving the device characteristics of the second transistor T2.

The stopper 170 is disposed on the fourth insulating film 124 in FIG. 3, but this is an example for better illustration. The stopper 170 may be disposed on any one of the insulating films 210 under the active layer A so as to overlap the drain area SDA2 such that it overlaps the first source drain area SDA1 and the second source drain area SDA2.

For example, the stopper 170 may include the same material as the active layer A. The stopper 170 may include an oxide semiconductor material. The stopper 170 may contain zinc oxide (ZnO), zinc-tin oxide (ZTO), zinc-indium oxide (ZIO), indium oxide (InO), titanium oxide (TiO), indium-gallium-zinc oxide (IGZO), indium-gallium-zinc oxide (IGZO), zinc-tin oxide (IZTO), or the like. When the stopper 170 and the active layer A include the same material, the adhesion between the stopper 170 and the active layer A increases and thus the conductivity of the source drain area SDA1 and the second source drain area SDA2 can be improved.

In addition, when the stopper 170 is formed using the same process as the active layer A or using the same material as the active layer A, the energy used for producing the display device can be reduced due to reduced process steps and ESG (environmental/social/governance) can be realized due to reduced generation of greenhouse gases.

In another embodiment, the stopper 170 may include a material different from the active layer A. In this case, the stopper 170 may contain a material having a hydrogen-capturing component. The stopper 170 may contain titanium (hereinafter referred to as "Ti"). Ti is highly capable of trapping hydrogen particles.

Specifically, the stopper 170 containing Ti contacts the active layer A and is adjacent to the channel region C2 of the active layer A to trap hydrogen diffused around the stopper 170, to stabilize hydrogen inside the stopper 170, and to suppress diffusion of hydrogen into the active layer A.

The stopper 170 containing Ti traps hydrogen particles in the adjacent insulating film 120 to prevent or at least reduce the hydrogen particles from reaching the active layer A, thereby securing the reliability of the transistor. The second transistor T2 having the stopper 170 containing Ti can reduce the amount of hydrogen that can flow into the active layer A, thereby reducing problems caused by the change in threshold voltage.

The stopper 170 may include any material other than Ti, for example, copper (referred to hereinafter as "Cu") or magnesium (referred to hereinafter as "Mg"), or an alloy thereof, as long as it is a metal with excellent hydrogen-trapping ability or hydrogen-capturing ability.

The second transistor T2 may further include a second blocking layer B2, and the second blocking layer B2 may be disposed between the third insulating film 123 and the fourth insulating film 124. The second blocking layer B2 is not necessarily disposed between the third insulating film 123 and the fourth insulating film 124, and the second blocking layer B2 may be disposed on any insulating film 120 under the active layer A as long as it is spaced from the stopper 170 and the active layer A.

The second blocking layer B2 may serve as a light blocking layer. The second blocking layer B2 can block external light incident on the active layer A. In addition, the second blocking layer B2 may be a wire that transmits current, power, or signals.

The second blocking layer B2 may overlap the active layer A and block external light from being directed to the active layer A. The width or area of the second blocking layer B2 may be greater than that of the active layer A in order to block external light incident at an angle from the side of the active layer A.

Specifically, the second blocking layer B2 of the second transistor T2 may be arranged to overlap the channel region, and source drain regions SDA1 and SDA2 of the active layer A.

The second blocking layer SDL2 may partially overlap the source drain regions SDA1 and SDA2 in a plan view of the display device.

The second blocking layer B2 below the active layer A and the gate electrode G disposed on top of the active layer A increase the effect of blocking external light and prevent or delay changes in the active layer A due to light, thereby minimizing or at least reducing the increase in the off-current level of the transistor and reducing leakage current.

The second blocking layer B2 may be formed of a conductive material, for example, a metal. The second blocking layer B2 may be formed of a single metal, but may also be formed of two or more metals, or an alloy of two or more metals. In addition, the second blocking layer B2 may be formed as a single layer or multiple layers.

A second blocking layer B2 may be disposed below the active layer A and the stopper 170 such that it is spaced from the stopper 170.

One bottom end of the second source drain electrode SD2 of the second transistor T2 is connected to the active layer A and the other bottom of the second source drain electrode SD2 is connected to the second blocking layer B2.

The stopper 170 is disposed to overlap the second blocking layer B2, and the area where the second source drain electrode SD2 is connected to the stopper 170 may be spaced apart from an area where the second source drain electrode SD2 is connected to the second blocking layer B2. Here, the second source drain electrode SD2 may be connected to the second blocking layer B2 such that it is spaced from the second active layer A2 in the plan view.

The second blocking layer B2 may be formed as a metal layer containing a titanium (Ti) material, which has excellent hydrogen particle-trapping ability. For example, the second blocking layer B2 may be a single layer of titanium, a double layer of molybdenum (Mo) and titanium (Ti), or an alloy of molybdenum (Mo) and titanium (Ti). The second blocking layer B2 may be another metal layer including titanium (Ti).

The second blocking layer B2 containing titanium (Ti) according to an embodiment traps hydrogen particles diffused in the insulating film 120 disposed between the active layer A and the second blocking layer B2 to prevent hydrogen particles from reaching the active layer A.

Therefore, the second transistor T2 according to an embodiment of the present disclosure can minimize or at least reduce the inflow or diffusion of hydrogen into the active layer and improve the reliability of the second transistor T2 through the stopper 170 containing a metal such as titanium that has the ability to collect hydrogen particles and the second blocking layer B2.

The second blocking layer B2 may be electrically connected to the second source drain electrode SD2 of the second transistor T2. When the second source drain electrode SD2 is connected to the second blocking layer B2, the effective voltage applied to the channel of the active layer A is inversely proportional to the parasitic capacitance between the active layer A and the second blocking layer B2, and the effective voltage applied to the active layer A can be controlled by controlling the parasitic capacitance between the active layer A and the second blocking layer B2.

In one embodiment, the second blocking layer B2 is adjacent to the active layer A between the fourth insulating film 124 and the third insulating film 123 below the active layer A, thereby increasing the parasitic capacitance between the two blocking layers B2. The electrical connection between the second blocking layer B2 and the second source drain electrode SD2 can reduce the actual current flowing through the active layer A and expand the gray-scale control range of the second transistor T2.

As a result, the second transistor T2 according to the present disclosure can be precisely controlled even at low gray levels and the problem of display mura that frequently occurs at low gray levels can be reduced.

Figure 4:
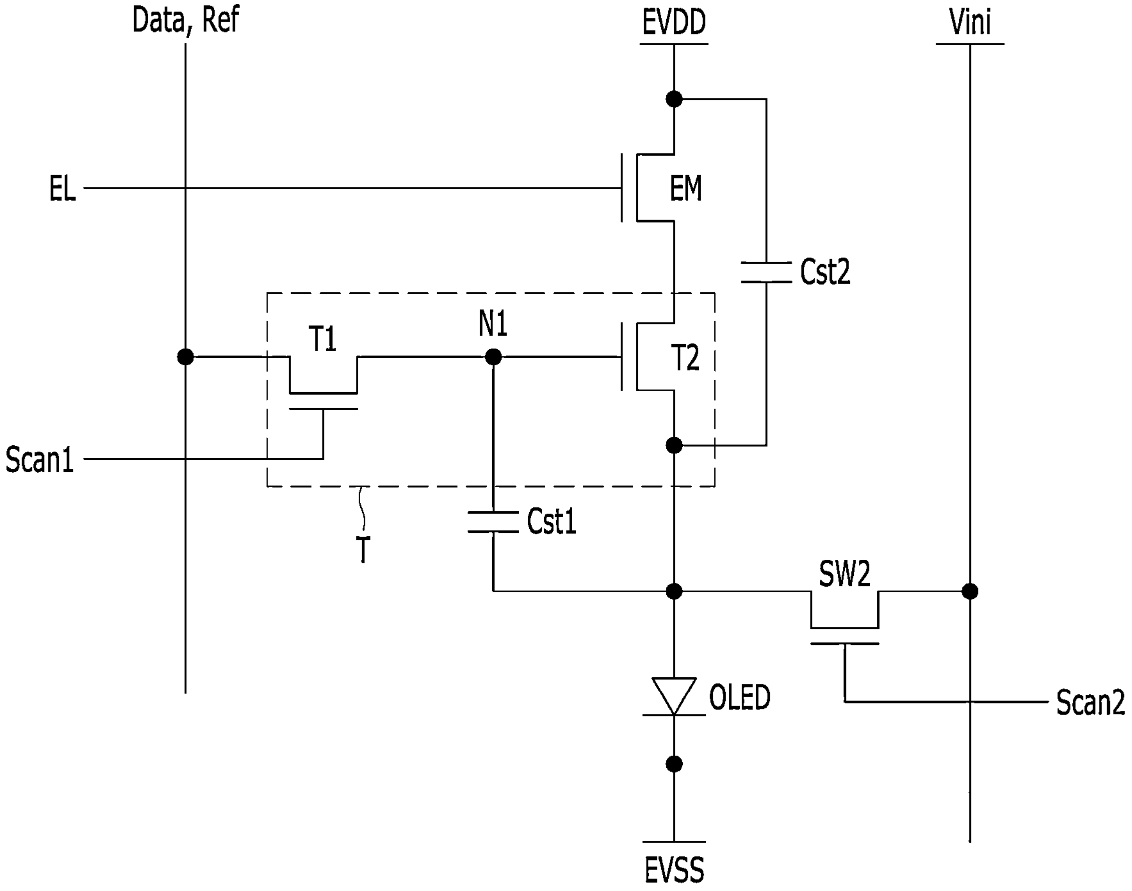
FIG. 4 is a circuit diagram illustrating a sub-pixel according to another embodiment.

FIG. 4 is a circuit diagram illustrating a sub-pixel according to another embodiment. Referring to FIG. 4, each sub-pixel SP according to another embodiment of the present disclosure includes a first transistor T1, a second transistor T2, a light emitting transistor EM, a switching transistor SW2, a first capacitor Cst1, a second capacitor Cst2, and an organic light emitting diode (OLED, 145; see FIG. 11).

Each of the first transistor T1, the second transistor T2, the light emitting transistor EM, and the switching transistor SW2 may be a P-type transistor or an N-type transistor. In the embodiment of FIG. 4, all transistors are illustrated as N-type transistors.

Each of the first transistor T1, the second transistor T2, the light emitting transistor EM, and the switching transistor SW2 is turned on when a high voltage is applied to the gate. The first transistor T1 may function as a data supply transistor, the second transistor T2 may function as a driving transistor, and the switching transistor SW2 may function as an initial transistor.

The gate of the first transistor T1 is connected to the first gate line Scan1, and the first electrode (e.g., drain electrode) of the first transistor T1 is connected to the data line Data or the reference line Ref. The second electrode (e.g., source electrode) of the first transistor T1 is connected to one electrode of the first capacitor Cst1 and the gate of the second transistor T2.

As a result, when the first gate signal is applied to the gate of the first transistor T1, the first transistor T1 applies a data signal or reference signal to one electrode of the first capacitor Cst1 or the gate of the second transistor T2.

The gate of the light emitting transistor EM is connected to the light emitting line EL, the first electrode of the light emitting transistor EM is connected to the high potential driving voltage (EVDD) and one electrode of the second capacitor Cst2, and the second electrode of the light emitting transistor EM is connected to the first electrode of the second transistor T2.

As a result, the data signal is applied to the gate of the second transistor T2 or the high potential driving voltage (EVDD) is transmitted to the organic light emitting diode (OLED) through the signal charged in the first capacitor Cst1.

The gate of the switching transistor SW2 is connected to the second gate line SCAN2, the first electrode of the switching transistor SW2 is connected to the initial line (Vini), and the second electrode of the switching transistor SW2 is connected between the second transistor of the second electrode T2 and the organic light emitting diode (OLED). The other electrode of the first capacitor Cst1 is connected between the second electrode of the second transistor T2 and the organic light emitting diode (OLED).

As a result, when the second gate signal is applied to the gate of the switching transistor SW2, the switching transistor SW2 initializes the node connected to the other electrode of the first capacitor Cst1 connected to the second electrode of the second transistor T2 or supplies the initial voltage to the organic light emitting diode (OLED).

The first electrode of the organic light emitting diode (OLED) is connected to the switching transistor SW2 or the second transistor T2, and the second electrode of the organic light emitting diode (OLED) is connected to the low potential driving voltage (EVSS).

As a result, when an initial voltage is applied to the first electrode of the organic light emitting diode (OLED), the organic light emitting diode (OLED) is initialized, or when a high potential driving voltage (EVDD) is applied to the first electrode of the organic light emitting diode (OLED), the current moves in the direction of low potential driving voltage (EVSS), and the organic light emitting diode (OLED) emits light. In one embodiment of the present disclosure, the low potential driving voltage (EVSS) may be lower than the high potential driving voltage (EVDD).

Each of the light emitting devices (OLEDs) may display light with one color among white, red, green, and blue.

Figure 5:
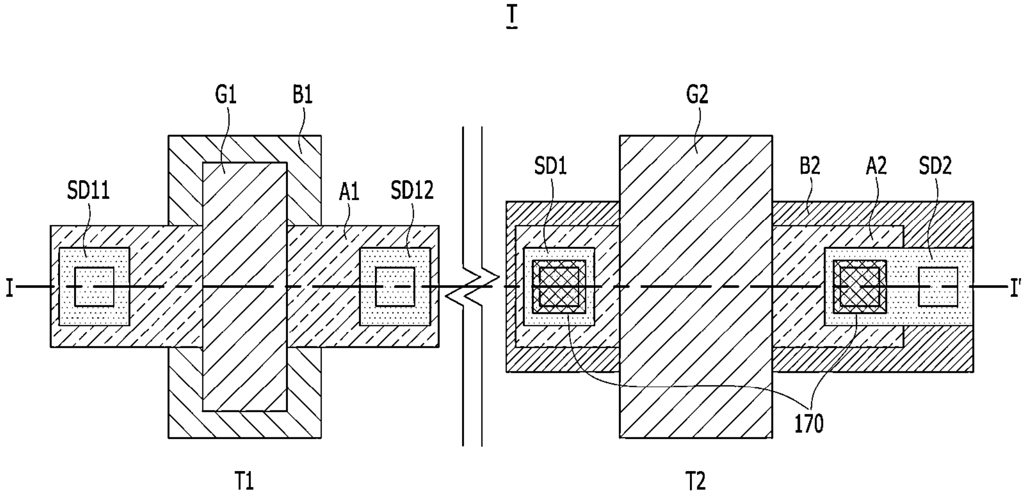
FIG. 5 is a plan view illustrating portion T of FIG. 4 according to one embodiment.
Figure 6:
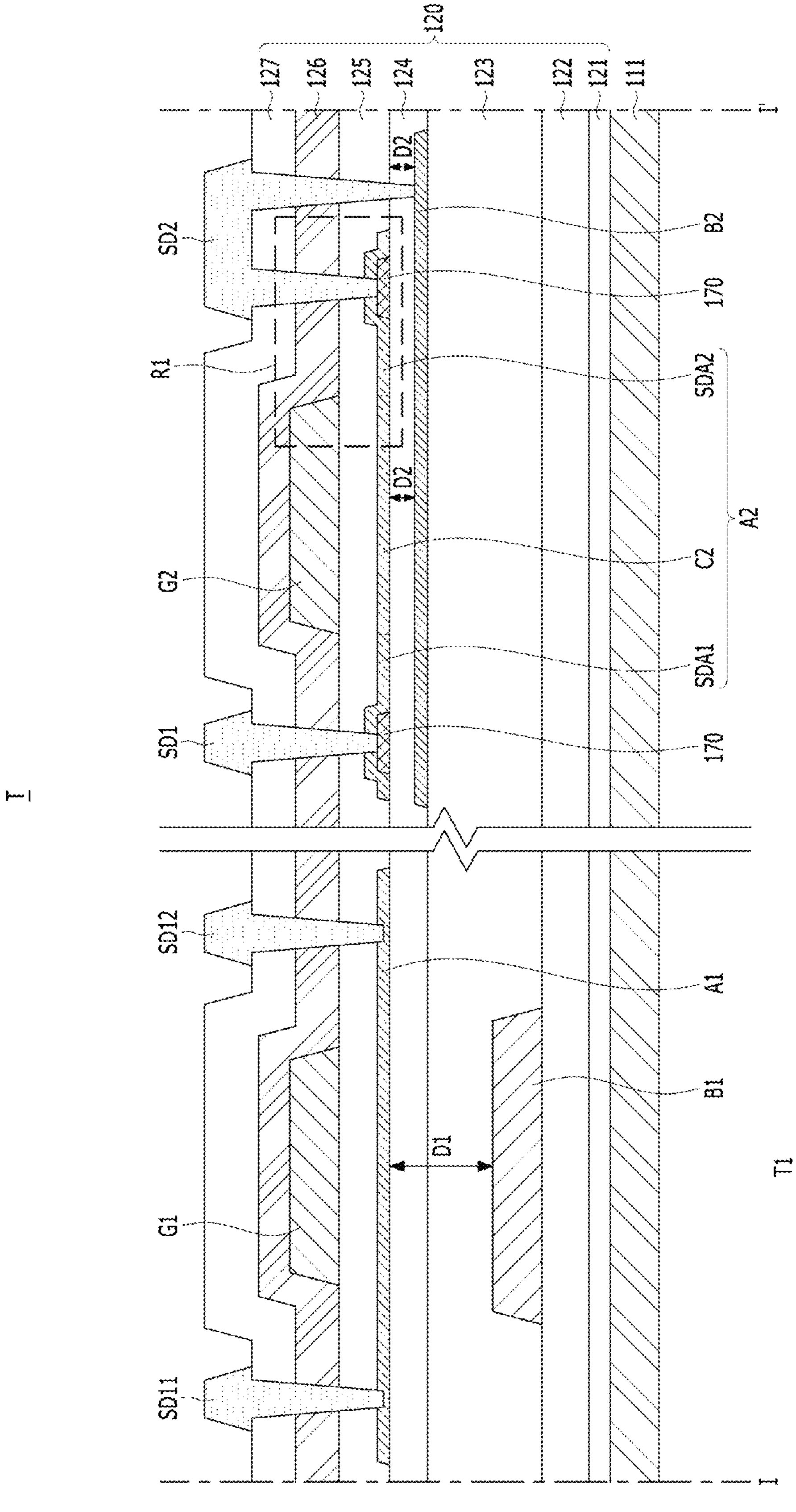
FIG. 6 is an example illustrating a cross-sectional view taken along line I-I' of FIG. 5 according to one embodiment.
Figure 7:
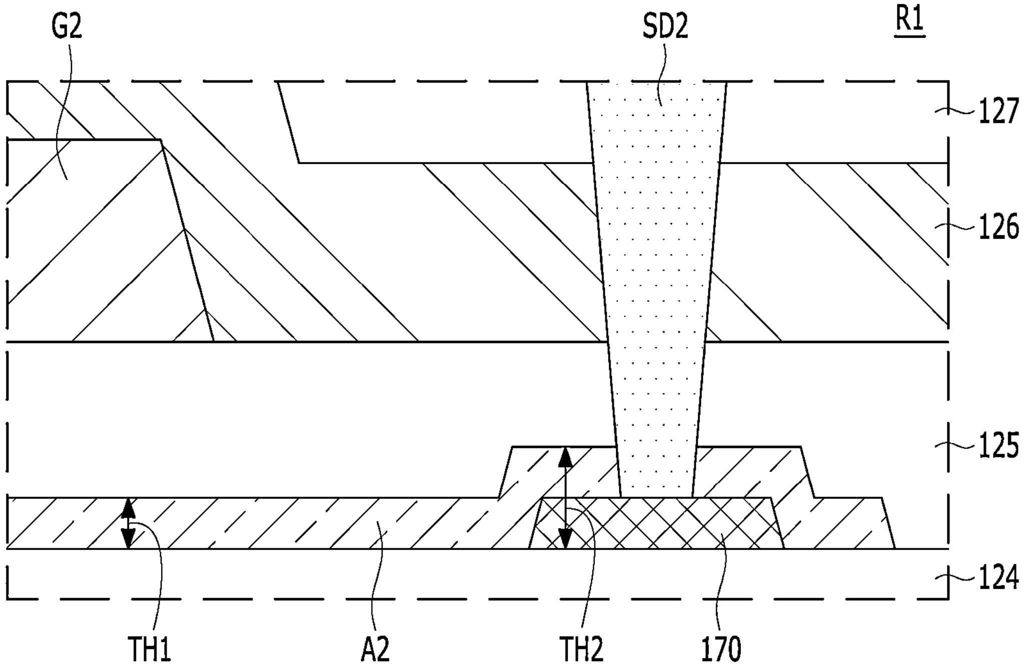
FIG. 7 is an enlarged partial plan view illustrating portion R1 of FIG. 6 according to one embodiment.

FIG. 5 is a plan view illustrating portion T according to the embodiment of FIG. 4, FIG. 6 is an example illustrating a cross-sectional view taken along line I-I' of FIG. 5 according to one embodiment, and FIG. 7 is an enlarged partial plan view illustrating portion R1 of FIG. 6 according to one embodiment.

Configurations having the same reference numerals described with reference to FIGS. 1 to 3 may be applied or implemented in the same manner as the embodiments described with reference to FIGS. 1 to 3, or may be applied or implemented as embodiments combined with the embodiments described with reference to FIG. 3, and detailed descriptions of components having the same reference numerals may be omitted.

Referring to FIGS. 5 and 6, the first transistor T1 and the second transistor T2 may include electrodes disposed between the insulating films 120 on the substrate 111. The first active layer A1 of the first transistor T1 and the second active layer A2 of the second transistor T2 may include an oxide semiconductor material. The first transistor T1 may be a transistor having a switching function and the second transistor T2 may be a transistor having a driving function.

The first transistor T1 is disposed on the same substrate 111 as the second transistor T2. A plurality of stacked insulating films 120 are disposed on the substrate 111 to insulate the electrodes constituting the first transistor T1 from each other. The insulating film 120 includes a first insulating film 121, a second insulating film 122, a third insulating film 123, a fourth insulating film 124, a fifth insulating film 125, a sixth insulating film 126, and a seventh insulating film 127. The multiple stacked insulating films 120 are the same as the insulating films 120 described in FIG. 3 and thus will be omitted below.

The first transistor T1 includes a first gate electrode G1, a first source drain electrode SD1, a second source drain electrode SD2, a first active layer A1, and a first blocking layer B1.

The first gate electrode G1 may be disposed to overlap the channel region of the first active layer A1 and may be disposed on top of the first active layer A1 with the insulating film 120 interposed therebetween. The first gate electrode G1 may be disposed on the same layer as the second gate electrode G2 of the second transistor T2 and may be formed of the same material as the second gate electrode G2.

The first source drain electrode SD11 and the second source drain electrode SD12 of the first transistor T1 are spaced apart from each other with the first gate electrode G1 and the insulating film 120 therebetween. The first source drain electrode SD11 of the first transistor T1 is connected to the first source drain region, and the second source drain electrode SD12 of the first transistor T1 is connected to the second source drain region.

The first source drain electrode SD11 and the second source drain electrode SD12 of the first transistor T1 may respectively be disposed on the same layer as the first source drain electrode SD1 and the second source drain electrode SD2 of the second transistor T2. The first source drain electrode SD11 and the second source drain electrode SD12 of the first transistor T1 contain the same material as the first source drain electrode SD1 and the second source drain electrode SD2 of the second transistor T2.

The first active layer A1 may be disposed on the same layer as the second active layer A2 of the second transistor T2 and may be formed of the same material as the second active layer A2.

The first transistor T1 includes a first blocking layer B1 disposed between the second insulating film 122 and the third insulating film 123. The first blocking layer B1 is not necessarily disposed between the second insulating film 122 and the third insulating film 123, and may be disposed on the insulating film 120 that allows the thickness D1 or the vertical distance of the insulating film 120 between the first blocking layer B1 and the first active layer A1 to be set greater than or equal to the thickness D2 or the vertical distance of the insulating film 120 between the first blocking layer B1 and the first active layer A1 of the second transistor T2.

The first blocking layer B1 may serve as a light blocking layer. The first blocking layer B1 may block external light incident on the first active layer A1. In addition, the first blocking layer B1 may be a wire that transmits current, power, or signals.

At least a part of the first blocking layer B1 overlaps the active layer A to reduce external light from being directed to the active layer A and thereby reduce the speed of change of the first active layer A1 due to light, thereby reducing an increase in the off-current level of the transistor or leakage current.

The width or area of the first blocking layer B1 may be larger than that of the gate electrode G1.

The first blocking layer B1 may be made of a conductive material, for example, a metal. The first blocking layer B1 may be made of a single metal, but may be formed of two or more metals, or an alloy of two or more metals. In addition, the first blocking layer B1 may be disposed as a single layer or multiple layers.

The first blocking layer B1 may be formed as a metal layer containing a titanium (Ti) material, which has excellent hydrogen particle-trapping ability. For example, the first blocking layer B1 may be a single layer of titanium, a double layer of molybdenum (Mo) and titanium (Ti), or an alloy of molybdenum (Mo) and titanium (Ti). The first blocking layer B1 may be another metal layer including titanium (Ti).

The first blocking layer B1 containing titanium (Ti) according to one embodiment traps hydrogen particles diffused in the insulating film 120 disposed between the first active layer A1 and the first blocking layer B1. The first blocking layer B1 prevents or at least reduces hydrogen particles from reaching the first active layer A1, thereby reducing degeneration of the first active layer A1 containing an oxide semiconductor material and improving reliability of the first transistor T1.

The first blocking layer B1 may be electrically connected to the first gate electrode G1 of the first transistor T1. When the first gate electrode G1 and the first blocking layer B1 are connected, the effective voltage applied to the channel of A is inversely proportional to the parasitic capacitance between the active layer A and the second blocking layer B2, thereby controlling the parasitic capacitance between the active layer A and the second blocking layer B2, and controlling the effective voltage applied to the active layer A.

In one embodiment, the first blocking layer B1 electrically connected to the first gate electrode G1 of the first transistor T1 may be disposed such that the thickness of the insulating film 120 between the first blocking layer B1 and the first active layer A1, that is, the first distance between the first blocking layer B1 and the first active layer A1 is greater than the thickness of the insulating film 120 between the second blocking layer B2 and the second active layer A2, that is, the second distance D2 between the second blocking layer B2 and the second active layer A2.

When the first distance D1 is greater than the second distance D2, it is possible to prevent excess electrons from increasing at the interface of the first active layer A1, reduce a decrease in the amount of charge in the channel of the first active layer A1 over time, and thereby improve the reliability of the first transistor T1 that functions as a switching transistor.

The first transistor T1 may form a dual gate with a first gate electrode G1 and a first blocking layer B1 electrically connected to the first gate electrode G1, and the dual gate can precisely control the flow of current flowing through the first active layer A1, realizing a high-resolution display device with a smaller size.

The first blocking layer B1 functions as a gate electrode and thus overlaps the channel area of the first active layer A1, but does not overlap (e.g., non-overlapping) the area of the first active layer A1 connected to the first source drain electrode. The width of the first blocking layer B1 may be greater than the width of the first gate electrode G1. In this case, the entire channel area of the first active layer A1 may be expanded, and the first blocking layer B1 can block light that flows into the channel area.

Since the first switching thin film transistor (ST) has a dual gate structure, the flow of current flowing in the third channel region 312C can be controlled more precisely and a high-resolution display device with a smaller size can be manufactured.

The first blocking layer B1 is formed of a metal material. For example, the first blocking layer B1 is formed as a single layer or multiple layers containing any one of molybdenum (Mo), aluminum (Al), chromium (Cr), gold (Au), titanium (Ti), nickel (Ni), neodymium (Nd), or copper (Cu), or an alloy thereof.

Configurations having the same reference numerals as those described with reference to FIG. 3 for the second transistor T2 may be applied or implemented in the same manner as the embodiments described with reference to FIG. 3, or may be applied or implemented as embodiments combined with the embodiments described with reference to FIG. 3, and detailed descriptions of components having the same reference numerals may be omitted.

Referring to FIGS. 5 to 7, the second transistor T2 includes a second gate electrode G2, a first source drain electrode SD1, a second source drain electrode SD2, a second active layer A2, a second blocking layer B2 and a stopper 170, and the components including a metal may be disposed with the insulating films 120 interposed therebetween.

The insulating film 120 includes a first insulating film 121, a second insulating film 122, a third insulating film 123, a fourth insulating film 124, a fifth insulating film 125, a sixth insulating film 126, and a seventh insulating film 127.

The first active layer A1 may be disposed on the fourth insulating film 124.

The first active layer A1 includes a channel region C2 overlapping the second gate electrode G2 and first and second source drain regions SDA1 and SDA2 connected to the first and second source drain electrodes SD1 and SD2.

The channel region C2 is an area that overlaps the second gate electrode G2 and through which carriers move. The channel region C2 may not be doped with impurities.

The first source drain area SDA1 and the second source drain area SDA2 are areas excluding the channel area C2, and are respectively connected to the first source drain electrode SD1 and the second source drain electrode SD2 to inject electrons and holes. The first source drain area SDA1 and the second source drain area SDA2 may be disposed on both sides of the channel area C2 with the channel area C2 interposed therebetween.

The second active layer A2 contains an oxide semiconductor material. The oxide semiconductor material is an oxide of metal such as zinc (Zn), indium (In), gallium (Ga), tin (Sn), and titanium (Ti), or a combination of a metal such as zinc (Zn), indium (In), gallium (Ga), tin (Sn), or titanium (Ti), and an oxide thereof.

More specifically, the oxide semiconductor material constituting the second active layer A2 include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), or the like.

The second active layer A2 of the second transistor T2 includes the oxide semiconductor material, thereby improving the effect of blocking leakage current and reducing power consumption.

A second gate electrode G2 may be disposed on the fifth insulating film 125. The second gate electrode G2 is insulated from the second active layer A2 through the fifth insulating film 125, and is arranged such that at least part of the gate electrode overlaps the second active layer A2 to form a channel region C2 in the second active layer A2.

The second gate electrode G2 may be formed of a conductive metal material. Specifically, the conductive metal material includes at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). The second gate electrode G2 may have a multilayer structure including at least two conductive metal materials.

The sixth insulating film 126 and the seventh insulating film 127 may be disposed on the second gate electrode G2. The sixth insulating film 126 covers the top and sides of the second gate electrode G2 and insulates the first source drain electrode SD1, the second source drain electrode SD2 and the second gate electrode G2 from each other.

A first source drain electrode SD1 and a second source drain electrode SD2 may be disposed on the seventh insulating film 127. The first source drain electrode SD1 and the second source drain electrode SD2 of the second transistor T2 may be spaced from each other with the second gate electrode G2 interposed therebetween. In this case, the first source drain electrode SD1 and the second source drain electrode SD2 of the second transistor T2, and the second gate electrode G2 may be disposed on different layers as described above.

The first source drain electrode SD1 and the second source drain electrode SD2 of the second transistor T2 may be formed of a conductive metal material. Specifically, the conductive metal material includes at least one of an aluminum-based metal such as aluminum (Al) or an aluminum alloy, a silver-based metal such as silver (Ag) or a silver alloy, a copper-based metals such as copper (Cu) or a copper alloy, a molybdenum-based metal such as molybdenum (Mo) or a molybdenum alloy, chromium (Cr), tantalum (Ta), neodymium (Nd), or titanium (Ti). The first source drain electrode SD1 and the second source drain electrode SD2 of the second transistor T2 may have a multilayer structure including at least two conductive metal materials.

The first source drain electrode SD1 and the second source drain electrode SD2 of the second transistor T2 are each connected to the second active layer A2. The first source drain electrode SD1 of the second transistor T2 is connected to the first source drain area SDA1 of the second active layer A2, and the second source drain electrode SD2 is connected to the second source drain area SDA2 of the second active layer A2. For example, each of the first source drain electrode SD1 and the second source drain electrode SD2 of the second transistor T2 may be connected to the second active layer A2 through contact holes of the sixth and seventh insulating films 126 and 127.

When the first source drain electrode SD1 and the second source drain electrode SD2 of the second transistor T2 are respectively connected to the second active layer A2, each of the first source drain electrode SD1 and the second source drain electrode SD2 of the second transistor T2 is connected to a stopper 170.

The stopper 170 prevents or at least reduces loss of the second active layer A2 that may occur during the etching process.

The stopper 170 may be disposed under the second active layer A2 to overlap the first source drain area SDA1 and the second source drain area SDA2 of the second active layer A2. The stopper 170 prevents or at least reduces the stopper 170 from being over-etched and thus prevents or at least reduces the second active layer A2 from being lost or reduces the area of the second active layer A2 that is lost during an etching process for connecting the first source drain electrode SD1 and the second source drain electrode SD2 of the second transistor T2 to the second active layer A2, for example, a process for forming a contact hole in the sixth insulating film 126 and the seventh insulating film 127.

Specifically, the stopper 170 may contact the second active layer A2 at the bottom of the first source drain electrode SD1 and the second source drain electrode SD2 of the second transistor T2. The stopper 170 protrudes from the top surface of the substrate 111, and does not overlap the second gate electrode G2, but overlaps the first source drain region SD1 and the second source drain region SD2.

Even if the second active layer A is lost during the etching process according to an embodiment of the present disclosure, each of the first source drain electrode SD1 and the second source drain electrode SD2 of the second transistor T2 may be connected to the stopper 170. Each of the first source drain electrode SD1 and the second source drain electrode SD2 of the second transistor T2 can smoothly inject electrons and holes into the second active layer A2 through the stopper 170 contacting the second active layer A2, and increase the area where each of the source drain electrodes SD1 and the second source drain electrode SD2 contacts the second active layer A2. As a result, even if the second active layer A2 is lost during the manufacturing process of the second transistor T2, the stopper 170 can prevent reduction of charge transfer.

The second transistor T2 can prevent or at least reduce the amount of current flowing in the second active layer A2 from decreasing through the stopper 170, and can maintain uniform luminance.

The second transistor T2 can maintain the level of the on-state current of the transistor uniformly through the stopper 170 and prevent the level of the off-state from rising, thereby reducing the occurrence of leakage current.

Referring to FIG. 7, the thickness TH1 of the second active layer A overlapping the second gate electrode G of the second transistor T2 may be smaller than a total of the thicknesses TH2 of the second active layer A2 and the stopper 170 overlapping the first source drain electrode SD1 or the second source drain electrode SD2 of the second transistor T2.

Furthermore, when the stopper 170 is disposed under the second active layer A2 as in one embodiment of the present disclosure, the thickness of the second active layer A2 can be reduced, the voltage threshold (Vth) can be increased, and the size of the transistor can be reduced due to the decrease in the channel thickness of the second active layer A2. In other words, the threshold voltage (Vth) may be lowered as the size of the transistor decreases. However, in the present disclosure, the threshold voltage (Vth) may be increased by reducing the thickness of the channel region C2 of the second active layer A2. As a result, it is possible to prevent reduction of the threshold voltage (Vth) and thus secure the stability and reliability of the transistor.

In one embodiment, the stopper 170 is arranged in a spaced pattern so as to overlap the bottom surface of the first source drain electrode SD1 of the second transistor T2 and the bottom surface of the second source drain electrode SD2 of the second transistor T2 on the insulating film 120, for example, the fourth insulating film 124, under the second active layer A2. At least a part of the top and side surfaces of the stopper 170 may contact the second active layer A2.

At least a part of the bottom surface of the first source drain electrode SD1 or the second source drain electrode SD2 of the second transistor T2 contacts the second active layer A2 and at least a part of the bottom surface of the first source drain electrode SD1 or the second source drain electrode SD1 of the second transistor T2 may contact the stopper 170.

The width or area of the stopper 170 may be greater than the width or area of the bottom of the first source drain electrode SD1 where the first source drain electrode SD1 of the second transistor T2 contacts the first source drain area SDA1, and may be greater than the width or area of the bottom of the second source drain electrode SD2 where the second source drain electrode SD2 of the second transistor T2 contacts the second source drain area SDA2.

When the width or area of the stopper 170 is greater than the width or area of the bottom of the first source drain electrode SD1 where the first source drain electrode SD1 of the second transistor T2 contacts the first source drain area SDA1, or the width or area of the bottom of the second source drain electrode SD2 of the second transistor T2 where the second source drain electrode SD2 contacts the second source drain area SDA2, it is possible to prevent reduction of the contact area between the electrode SD2 and the active layer A and an increase in resistance. The stopper 170 according to the present disclosure can improve the charge flow of the second transistor T2, thereby improving the device characteristics of the second transistor T2.

For example, the stopper 170 may include the same material as the second active layer A2. The stopper 170 may include an oxide semiconductor material. The stopper 170 may contain zinc oxide (ZnO), zinc-tin oxide (ZTO), zinc-indium oxide (ZIO), indium oxide (InO), titanium oxide (TiO), indium-gallium-zinc oxide (IGZO), indium-gallium-zinc oxide (IGZO), zinc-tin oxide (IZTO), or the like. When the stopper 170 and the second active layer A2 include the same material, the adhesion between the stopper 170 and the second active layer A2 increases and the conductivity of the source drain area SDA1 and the second source drain area SDA2 of the second transistor can be improved.

In addition, when the stopper 170 is formed using the same process as the second active layer A2 or using the same material as the active layer A, the energy used for producing the display device can be reduced due to reduced process steps and ESG (environmental/social/governance) can be realized due to reduced generation of greenhouse gases.

In another embodiment, the stopper 170 may include a material different from the second active layer A2. In this case, the stopper 170 may contain a material having a hydrogen-capturing component. The stopper 170 may contain titanium (hereinafter referred to as "Ti"). Ti is highly capable of trapping hydrogen particles.

Specifically, the stopper 170 containing Ti contacts the second active layer A2 and is adjacent to the channel region C2 of the second active layer A2 to trap hydrogen diffused around the stopper 170, to stabilize hydrogen inside the stopper 170, and to suppress diffusion of hydrogen into the second active layer A2.

The stopper 170 containing Ti traps hydrogen particles in the adjacent insulating film 120 to prevent the hydrogen particles from reaching the second active layer A2, thereby securing the reliability of the transistor. The stopper 170 may further include a material other than Ti as long as the material is capable of trapping hydrogen and improving the device characteristics of the second transistor T2.

The first transistor T1 may be formed as a dual gate, and the second transistor T1 may be formed as a single gate. In an embodiment according to the present disclosure, the thickness D1 of the insulating film 120 from the top surface of the first blocking layer B1 of the first transistor T1 to the bottom surface of the first active layer A1 is greater than the thickness D2 of the insulating film 120 from the upper surface of the second blocking layer B2 of the second transistor T2 to the lower surface of the second active layer A2.

For this purpose, the first blocking layer B1 may be disposed on a different layer from the second blocking layer B2. Specifically, the first blocking layer B1 of the first transistor T1 may be disposed on the second insulating film 122, and a third insulating film 123 and a fourth insulating film 124 may be disposed between the first blocking layer B1 and the first active layer A1.

Although not shown in FIG. 6, the first blocking layer B1 of the first transistor T1 is electrically connected to the first gate electrode G1, and the second blocking layer B2 of the second transistor T2 is electrically connected to the second source drain electrode SD2 of the second transistor T2. The same voltage as that of the first gate electrode G1 may be applied to the first blocking layer B1 of the first transistor T1, and the same voltage as that of the second source drain electrode SD2 of the second transistor T2 may be applied to the second blocking layer B2 of the second transistor T2.

When the first distance D1 from the first blocking layer B1 of the first transistor T1 to the first active layer A1 is greater than the second distance D2, it is possible to prevent the excessive increase of electrons at the interface of the first active layer A1 and reduce the decrease in the amount of charge in the channel of the first active layer A1 over time, thereby improving reliability of the first transistor T1 functioning as a switching transistor.

The second transistor T2 can reduce the current actually flowing through the second active layer A2 through the electrical connection between the second blocking layer B2 and the second source drain electrode SD2, and expand the grayscale control range of the second transistor T2.

As a result, the second transistor T2 according to the present disclosure functions as a driving transistor, enabling precise control even in low gray levels and reducing the problem of mura that frequently occurs in low gray levels.

The stopper 170 is disposed on the fourth insulating film 124, but this is an example for better illustration. The stopper 170 may be disposed on any one of the insulating films 210 under the second active layer A2 so as to overlap the drain area SDA2 such that it overlaps the first source drain area SDA1 and the second source drain area SDA2.

Figure 8:
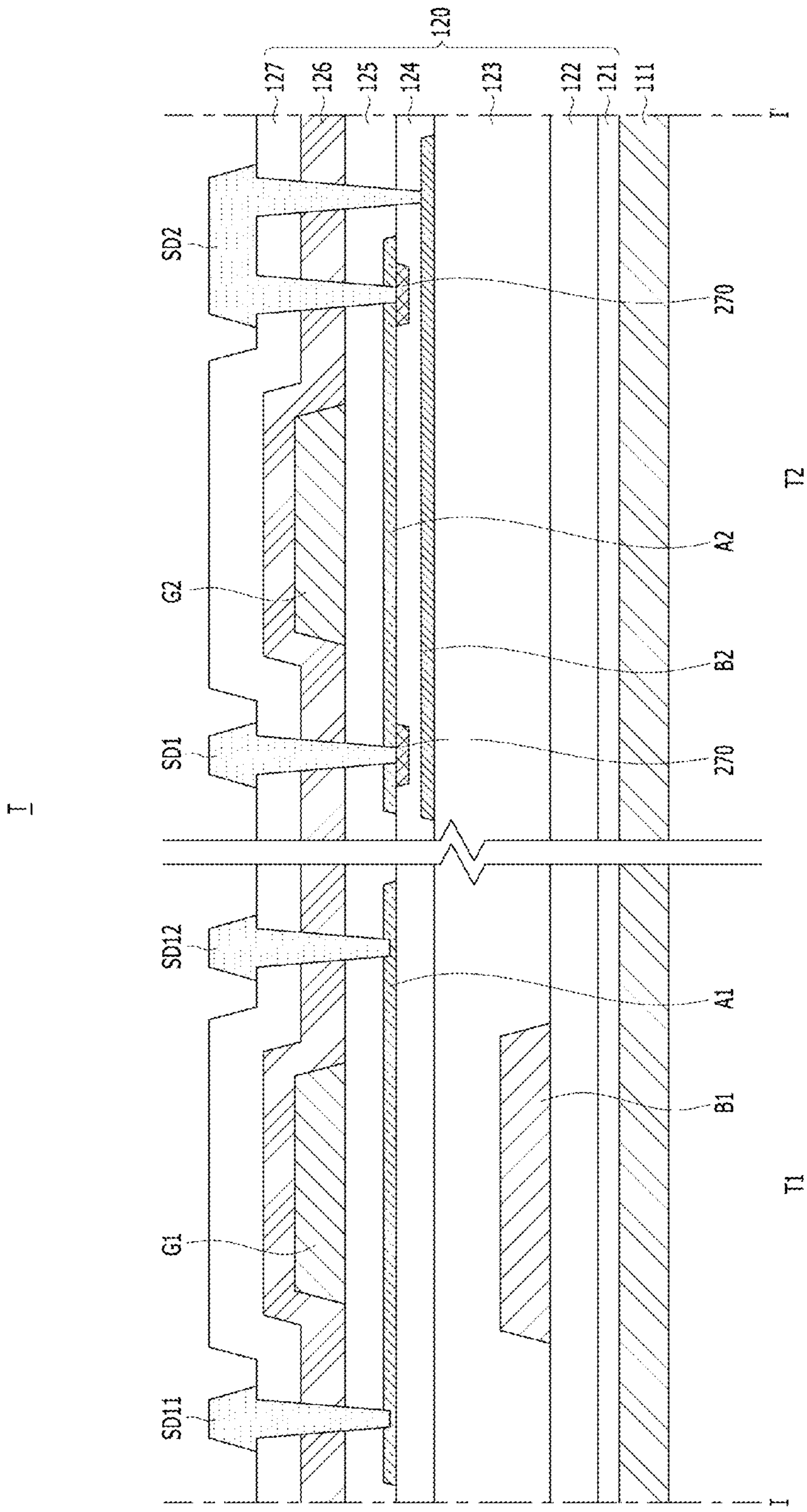
FIG. 8 illustrates a cross-sectional view taken along line I-I' of FIG. 5 according to another embodiment.

The stopper 270, and the like according to another embodiment of the present disclosure will be described with reference to FIG. 8. Configurations having the same reference numerals as those described with reference to FIGS. 1 to 7 for the second transistor T2 may be applied or implemented in the same manner as the embodiments described with reference to FIGS. 1 to 7, or may be applied or implemented as embodiments combined with the embodiments described with reference to FIGS. 1 to 7, and detailed descriptions of components having the same reference numerals may be omitted.

The second transistor T2 according to another embodiment of the present disclosure includes a second gate electrode G2, a first source drain electrode SD1, a second source drain electrode SD2, a second active layer A2, a second blocking layer B2, and a second stopper 270, and components including the same may be disposed with the insulating films 120 interposed therebetween.

The second stopper 270 according to another embodiment of the present disclosure is arranged to fill the insulating film 120 below the second active layer A2, such that at least a part of the top surface of the second stopper 270 contacts the second active layer A2.

The second stopper 270 may fill the fourth insulating film 124 and may be flattened to be flush with the top surface of the fourth insulating film 124. The top surface of the second stopper 270 may contact the bottom surface of the second active layer A2. When the second stopper 270 fills the second stopper 270 and the fourth insulating film 124, the occurrence of steps can be reduced and the defect rate caused by the steps can be reduced.

The materials constituting the second stopper 270 and the technical effects resulting from the second stopper 270 are as described above and thus will be omitted below.

Figure 9:
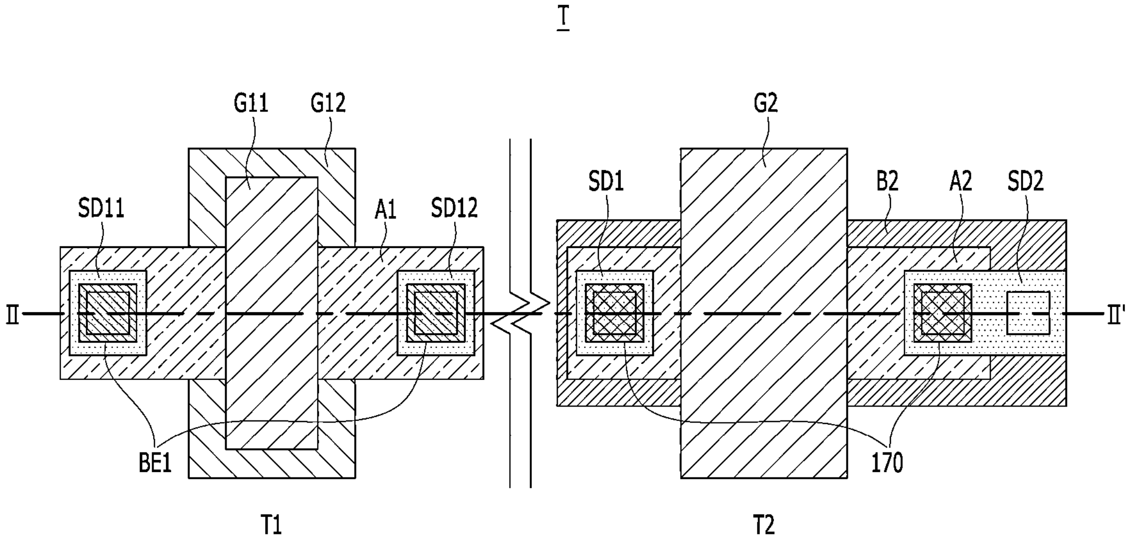
FIG. 9 is a plan view illustrating portion T shown in FIG. 4 according to another embodiment.
Figure 10:
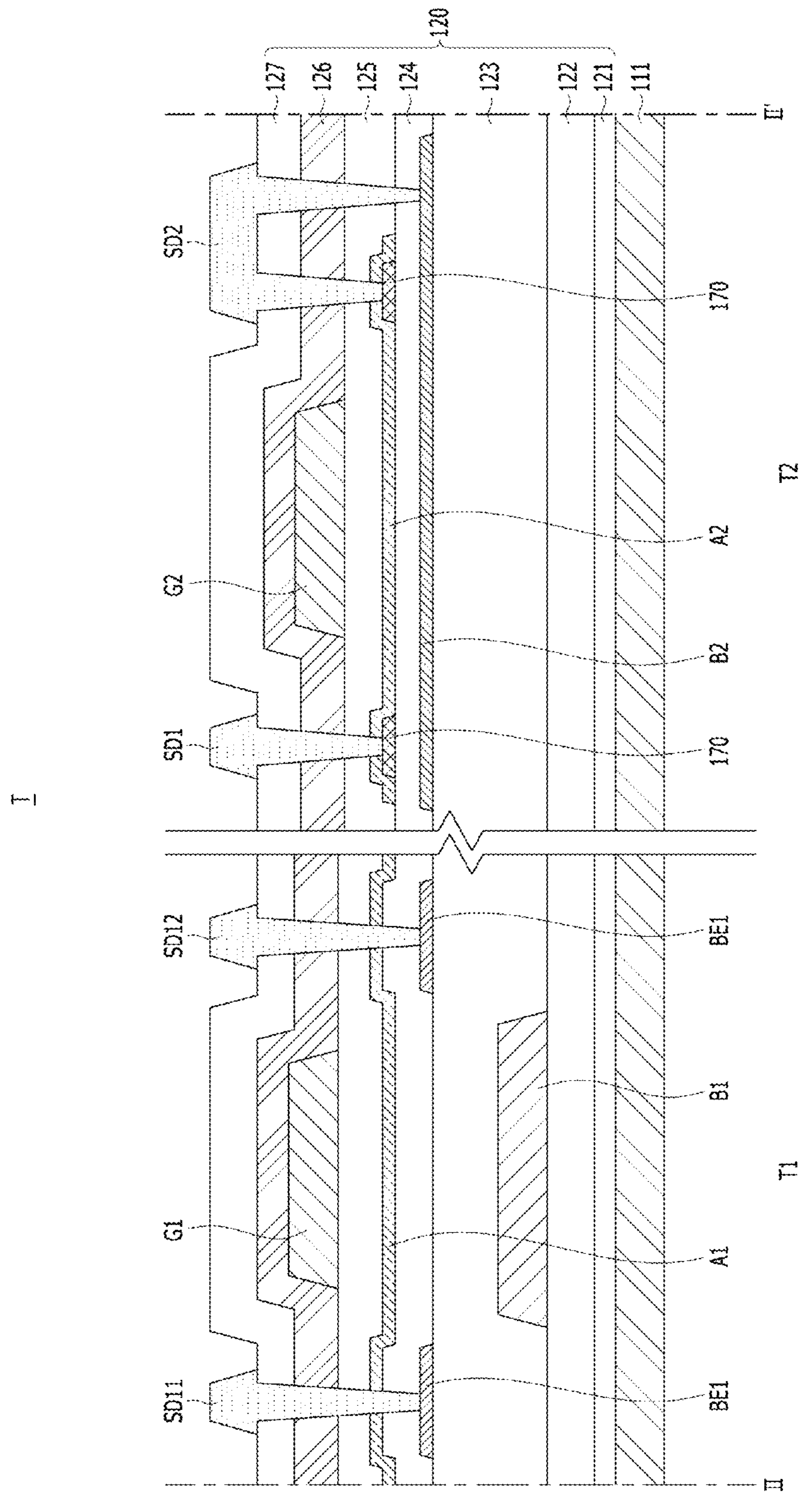
FIG. 10 is an example illustrating a cross-sectional view taken along line II-II' of FIG. 9 according to one embodiment.

The first transistor T1 and the like according to another embodiment of the present disclosure will be described with reference to FIGS. 9 and 10. Configurations having the same reference numerals as those described with reference to FIGS. 1 to 9 may be applied or implemented in the same manner as the embodiments described with reference to FIGS. 1 to 9, or may be applied or implemented as embodiments combined with the embodiments described with reference to FIGS. 1 to 9, and detailed descriptions of components having the same reference numerals may be omitted.

The first transistor T1 according to another embodiment of the present disclosure may further include a bottom electrode BE1.

The bottom electrode BE1 may be disposed on the fourth insulating layer 124 below the first active layer A1 so as to overlap the source drain region of the first active layer A1. The bottom electrode BE1 may contact the first source drain electrode SD11 and the second source drain electrode SD12 of the first transistor T1.

At least a part of the side surface of the first source drain electrode SD11 and the second source drain electrode SD12 of the first transistor T1 contacts at least a part of the first active layer A1 and penetrates the first active layer A1 and contacts the top surface of the bottom electrode BE1.

The bottom electrode BE1 protrudes from the top surface of the substrate 111, does not overlap the first gate electrode G1, and overlaps the first source drain electrode SD11 and the second source drains electrode SD12 of the first transistor T1. The bottom electrode BE1 is disposed below the first active layer A1. During the etching process for forming contact holes for the first source drain electrode SD11 and the second source drain electrode SD12, the first active layer A1 may be lost or over-etched, so that the first active layer A1 may be penetrated and the insulating film 124 disposed thereunder may be removed. In this case, the bottom electrode BE1 fills the contact hole and contacts the bottom surface of the first source drain electrode SD11 and the second source drain electrode SD12 of the first transistor T1 disposed up to the bottom of the first active layer A1. The bottom electrode BE1 can prevent over-etching of the bottom electrode BE1 and the lower part thereof when forming the contact hole for disposing the first source drain electrode SD11 and the second source drain electrode SD12 of the first transistor T1.

The bottom electrode BE1 may be disposed on the same layer as the second blocking layer B2 of the second transistor T2. The bottom electrode BE1 may be made of the same material as the second blocking layer B2 of the second transistor T2.

The display device 100 including the transistor according to another embodiment of the present disclosure will be described with reference to FIG. 11. Configurations having the same reference numerals as those described with reference to FIGS. 1 to 10 may be applied or implemented in the same manner as the embodiments described with reference to FIGS. 1 to 10, or may be applied or implemented as embodiments combined with the embodiments described with reference to FIGS. 1 to 10, and detailed descriptions of components having the same reference numerals may be omitted.

Referring to FIG. 11, the display device 100 according to the present disclosure includes a first transistor T1 and a second transistor T2, and may further include a planarization film 130, a bank 135, a light emitting device 145, and an encapsulation layer 150 disposed on the first transistor T1 and the second transistor T2.

The planarization film 130 may be disposed on the second transistor T2 to protect the first transistor T1 and the second transistor T2 and to reduce the step caused by the first transistor T1 and the second transistor T2.

In order to prevent or at least reduce the generation of parasitic capacitance between the first transistor T1, the second transistor T2, the wires, and the organic light emitting diode 145, the planarization film 130 may be disposed between the structures or components.

The planarization film 130 may be disposed on the insulating film 120 of the planarization film 130 to provide a flat surface.

The planarization film 130 may include an organic material. The organic material includes at least one of an acryl resin, a phenolic resin, a polyimide resin, an unsaturated polyester resin, a polyamide resin, benzocyclobutene, a polyphenylene resin, or a polyphenylene sulfide resin.

The planarization film 130 may be disposed as a composite laminate including an inorganic insulating material film and an organic insulating material film. In addition to the insulating film 120 described above, various organic or inorganic materials may be disposed between the substrate 111 and the planarization film 130.

The bank 135 is a pixel-defining layer to expose the first electrode E1 of each sub-pixel SP. The bank 135 may include an opaque material (e.g., black) to prevent light interference between adjacent sub-pixels SP. In this case, the bank 135 may include a light-blocking material formed of at least one of a color pigment, organic black, or carbon.

The organic light emitting diode 145 is disposed on the planarization film 130 in the display area AA.

The organic light emitting diode 145 includes a first electrode E1, a light emitting layer EL, and a second electrode E2. The organic light emitting diode 145 may be electrically connected to the second transistor T2 through the planarization film 130. The first electrode E1 of the organic light emitting diode 145 and the second source drain electrode SD2 of the second transistor T2 are electrically connected to each other.

The first electrode E1 may function as an anode. The first electrode E1 may pass through the planarization film 130 and may be connected to the second transistor T2.

The first electrode E1 may include a metal material with high reflectivity. For example, the first electrode E1 has a multilayer structure such as a laminate structure (Ti/Al/Ti) of aluminum (Al) and titanium (Ti), a laminate structure (ITO/Al/ITO) of aluminum (Al) and ITO, an APC (Ag/Pd/Cu) alloy, a laminated structure (ITO/APC/ITO) of an APC alloy and ITO, or a laminated structure (Ag/MoTI) of silver (Ag) and molybdenum/titanium alloy, or a single layer structure containing any one selected from silver (Ag), aluminum (Al), molybdenum (Mo), gold (Au), magnesium (Mg), calcium (Ca), or barium (Ba), or an alloy containing two or more thereof. The first electrode E1 may be called a "reflective electrode".

A light emitting layer EL is provided on the first electrode E1. The light emitting layer EL may include a hole injection layer, a hole transport layer, an organic light emitting layer, an electron transport layer, and an electron injection layer.

When a voltage is applied to the first electrode E1 and the second electrode E2, holes are transferred to the organic light emitting layer through the hole injection layer and the hole transport layer, electrons are transferred to the organic light emitting layer through the electron injection layer and the electron transport layer, the holes recombine with the electrons in the organic light emitting layer to form excitons, and the energy of excitons drops from the excited state to the ground state, thus causing light emission.

The light emitting layer EL may include a red light emitting layer that emits red light, a green light emitting layer that emits green light, and a blue light emitting layer that emits blue light. The red light emitting layer, the green light emitting layer, and the blue light emitting layer may be arranged for each sub-pixel SP on the first electrode E1.

The red light emitting layer may be patterned in the red sub-pixel, the green light emitting layer may be patterned in the green sub-pixel, and the blue light emitting layer may be patterned in the blue sub-pixel, but these configurations are not limited thereto. At least two organic light emitting layers among the red light emitting layer, the green light emitting layer, and the blue light emitting layer may be stacked and disposed in one sub-pixel SP.

The light emitting layer EL may be a white light emitting layer that emits white light. In this case, the light emitting layer EL may be a common layer in which one or more non-patterned layers are commonly disposed in the sub-pixels SP.

As previously described, the light emitting layer EL may be arranged in a tandem structure of two or more stacks (STACK). In this case, each light emitting device 145 may include a charge generation layer disposed between stacks.

The charge generation layer may be a common layer disposed on the entire surface of the display area AA.

A second electrode E2 is provided on the light emitting layer EL. The second electrode E2 may function as a cathode.

The second electrode E2 may be disposed not only in the light emitting area of the sub-pixel SP but also in the entire region of the display area AA, but is not limited thereto. The second electrode E2 may be a common layer that is commonly disposed in the sub-pixels SP and applies the same voltage thereto. For this purpose, the second electrode E2 may be arranged to extend from the display area AA to a part of the non-display area NA.

The second electrode E2 may be a light-transmitting electrode. The second electrode E2 may include a transparent metal material (TCO, transparent conductive material) such as ITO or IZO that can transmit light, or include a semi-transmissive conductive material such as magnesium (Mg), silver (Ag), or an alloy of magnesium (Mg) and silver (Ag). When the second electrode E2 is formed of a translucent metal material, light output efficiency can be increased due to microcavities.

As an example of the organic light emitting diode 145, a front light emitting type has been described above, but the organic light emitting diode 145 of the present disclosure is not limited thereto. The organic light emitting diode 145 may be a bottom-emitting type in which light emitted from the light emitting layer EL is emitted toward the substrate 111. In this case, the first electrode E1 may be formed of a transparent or translucent electrode material, and the second electrode E2 may be formed of a reflective electrode material.

An encapsulation layer 150 is disposed on the organic light emitting diode 145. The encapsulation layer 150 may cover the display area AA and the non-display area NA to prevent oxygen or moisture from penetrating into the organic light emitting diode 145. If necessary, other layers such as a capping layer may be interposed between the encapsulation layer 150 and the second electrode E2.

The encapsulation layer 150 may include multiple layers. The encapsulation layer 150 may have a structure in which inorganic films containing an inorganic insulating material and organic films containing an organic insulating material are alternately stacked. For example, the inorganic insulating material may include one or more materials such as silicon oxide, silicon nitride, and/or silicon oxynitride.

The organic insulating material may include at least one selected from the group consisting of polyethylene terephthalate, polyethylene naphthalate, polycarbonate, polyimide, polyethylene sulfonate, polyoxymethylene, polyarylate, and hexamethyldisiloxane.

The display device 100 can prevent an amount of current flowing in the second active layer A2 from being reduced, and can decrease a change of luminance in the display area.

The display device 100 can maintain the level of the on-current of the transistor uniformly and prevents the level of the off-current from increasing through the second transistor T2 having the stoppers 170 and 270, thereby reducing the occurrence of leakage current.

The display device 100 according to the present disclosure can reduce the energy required to produce display devices by reducing the process steps when the stoppers 170 and 270 are arranged in the same process as the electrode material disposed at the non-display area NA or are arranged using the same process as the electrode material disposed at the display area AA, and can reduce the generation of greenhouse gases that may occur during the manufacturing process, thereby realizing ESG (environmental/social/governance).

In addition, the transistor and the display device 100 according to the present disclosure improve reliability, thereby reducing the relative rates of defects, reducing the energy required for producing the display device 100, and reducing the consumption of harmful production substances or regulations, thus being advantageous for recycling and obtaining an eco-friendly display device 100.

In the embodiments of the present disclosure, the active layers of the first transistor T1 and the second transistor T2 among the plurality of transistors constituting one sub-pixel SP are described as including an oxide semiconductor material, but the active layers of all transistors constitute the sub-pixel SP may include an oxide semiconductor material.

As apparent from the foregoing, the transistor and the display device including the same according to the present disclosure can exhibit improved reliability.

The transistor and the display device including the same according to the present disclosure can increase the threshold voltage and reduce the size.

The transistor and the display device including the same according to the present disclosure can maintain a uniform on-state current level, prevent an increase in the level of the off-state current, and reduce the occurrence of leakage current.

The transistor and the display device including the same according to the present disclosure can prevent a decrease in the amount of current flowing in the active layer and thereby provide uniform luminance.

The transistor and display device according to the present disclosure can reduce the amount of hydrogen flowing into the active layer and thereby improve problems caused by a change in threshold voltage.

The transistor functioning as a switching transistor can control the flow of current flowing in the active layer, thereby reducing the size, and the transistor functioning as a driving transistor expands the gray-scale control range, thereby preventing a display mura in low gray scales.

The transistor and display device according to the present disclosure reduce the defect rates of display devices, reduce the amounts of materials used throughout the manufacturing process, such as gas and etchants to manufacture display devices, and reduce greenhouse gases generated by the manufacturing process.

The transistor and display device according to the present disclosure reduce the amount of material used in the process to improve recycling and thereby reduce carbon emissions.

It will be apparent to those skilled in the art that various modifications and variations can be made in the disclosure without departing from the spirit or scope of the disclosure. Thus, it is intended that the disclosure cover such modifications and variations thereof, provided they fall within the scope of the appended claims and their equivalents.

What is claimed is:

1. A display device comprising:

a substrate including a display area and a non-display area;

a first transistor at the display area, the first transistor including a first gate electrode and a first active layer;

a second transistor at the display area, the second transistor including a second gate electrode, a first source drain electrode, a second source drain electrode, and a stopper, wherein the stopper contacts a second active layer at a bottom of each of the first source drain electrode and the second source drain electrode of the second transistor; and a second blocking layer below the second active layer and the stopper, the second blocking layer spaced apart from the stopper, wherein one bottom of the second source drain electrode of the second transistor is connected to the second active layer, and another bottom of the second source drain electrode is connected to the second blocking layer.

2. The display device according to claim 1, wherein the second active layer comprises an oxide semiconductor material, and the stopper comprises a same material as the second active layer.

3. The display device according to claim 1, wherein the second active layer comprises a material different from the stopper, and the stopper comprises a hydrogen-capturing component.

4. The display device according to claim 1, wherein the stopper is on an insulating film below the second active layer such that at least a part of a top surface and a side surface of the stopper contacts the second active layer, and an area of the stopper is larger than an area of a bottom surface of the first source drain electrode or the second source drain electrode.

5. The display device according to claim 1, wherein at least a part of a bottom surface of the first source drain electrode or the second source drain electrode of the second transistor contacts the second active layer, and at least a part of the bottom surface of the first source drain electrode or the second source drain electrode contacts the stopper.

6. The display device according to claim 1, wherein a thickness of the second active layer that overlaps the second gate electrode of the second transistor is smaller than a total of thicknesses of the second active layer and the stopper that overlap the first source drain electrode or the second source drain electrode of the second transistor.

7. The display device according to claim 1, wherein the stopper is non-overlapping with the second gate electrode disposed above the second active layer.

8. The display device according to claim 1, wherein the stopper fills an insulating film under the second active layer such that at least a part of a top surface of the stopper contacts the second active layer.

9. The display device according to claim 1, wherein:

the stopper overlaps the second blocking layer, an area where the second source drain electrode is connected to the stopper is spaced apart from an area where the second source drain electrode is connected to the second blocking layer, and the second source drain electrode is connected to an area of the second blocking layer which is spaced apart from the second active layer in a plan view of the display device.

10. The display device according to claim 1, wherein the first transistor further comprises a first blocking layer that is under the first active layer and overlaps the first gate electrode with the first active layer interposed therebetween, wherein a width of the first blocking layer is greater than a width of the first gate electrode and the first blocking layer is electrically connected to the first gate electrode.

11. The display device according to claim 10, wherein a vertical distance between the first blocking layer and the first active layer is greater than a vertical distance between the second blocking layer and the second active layer.

12. The display device according to claim 1, wherein the first transistor further comprises a bottom electrode below the first active layer, and the bottom electrode is non-overlapping with the first gate electrode while overlapping a source drain region of the first active layer, wherein the bottom electrode is under an insulating film that is under the first active layer or the second active layer and is connected to each of the first source drain electrode of the first transistor and the second source drain electrode of the first transistor.

13. The display device according to claim 12, wherein the bottom electrode of the first transistor comprises a same material as the second blocking layer of the second transistor and is on a same layer as the second blocking layer of the second transistor.

14. The display device according to claim 1, wherein:

the first active layer of the first transistor comprises an oxide semiconductor material, and the first transistor is a switching transistor, and the second transistor is a driving transistor.

15. The display device according to claim 1, wherein a first gate signal is applied to the first gate electrode of the first transistor, and one end of the second source drain electrode of the first transistor is electrically connected to the second gate electrode of the second transistor.

16. The display device according to claim 1, further comprising:

a light emitting element over the first transistor and the second transistor at the display area, the light emitting element including a first electrode, an organic light emitting layer, and a second electrode, wherein the first electrode is electrically connected to the second source drain electrode of the second transistor.

* * * * *